United States Patent [19]

Weimer

[11] 4,362,988
[45] Dec. 7, 1982

[54] METHOD OF AND CIRCUIT ARRANGEMENT FOR DETERMINING THE MAGNITUDE OF AN UNKNOWN RESISTANCE ELEMENT

[75] Inventor: Günther Weimer, Gerlingen, Fed. Rep. of Germany

[73] Assignee: Centra-Burkle GmbH & Co., Schonaich, Fed. Rep. of Germany

[21] Appl. No.: 157,067

[22] Filed: Jun. 6, 1980

[30] Foreign Application Priority Data

Jun. 7, 1979 [DE] Fed. Rep. of Germany ....... 2923026

[51] Int. Cl.$^3$ ............................................. G01R 27/02
[52] U.S. Cl. ..................................................... 324/62
[58] Field of Search ................... 324/62, 63, 98, 99 D; 340/347 M, 347 CC, 347 AD

[56] References Cited

U.S. PATENT DOCUMENTS

| | | | |
|---|---|---|---|
| 3,316,896 | 5/1967 | Thomasset | 307/359 X |
| 3,490,039 | 1/1970 | Tsao | 324/62 R |
| 3,875,501 | 4/1975 | Hayashi | 324/62 |
| 4,217,543 | 8/1980 | Strong | 324/62 |

OTHER PUBLICATIONS

Furlow, Circuit Design Idea Handbook, Cahners Books, 1974, p. 177.

Garland et al., Single-IC Capacitance Meter, Popular Electronics, 2/74, pp. 44 & 45.
Scott, 555 IC Timer Circuits, 9/76 (no further information).

*Primary Examiner*—T. J. Sloyan
*Attorney, Agent, or Firm*—Karl F. Ross

[57] ABSTRACT

In order to ascertain the magnitude $R_i$ of an unknown resistance element in digital terms, two calibrating resistances of known magnitudes $R_1$ and $R_2 = mR_1$ (with $m > 1$) are connected in circuit with a capacitor, to form a switchable RC network, during two gating periods whereas the unknown resistance element is inserted in their place during a third gating period. A multiplicity of counting pulses are fed during each gating period to a pulse counter delivering their count to an arithmetic unit which determines the ratio $R_i/R_1$ from the several pulse counts and from the factor m. The switchable RC network may be part of a one-shot pulse generator, establishing a variable gating period for counting pulses of a fixed cadence, or of an astable multivibrator generating different counting pulse rates during gating periods of constant duration. The fixed pulse cadence or the constant gating periods are established by another RC network which may share a common coincidence (AND, NAND or NOR) gate with the switchable network.

4 Claims, 4 Drawing Figures

METHOD OF AND CIRCUIT ARRANGEMENT FOR DETERMINING THE MAGNITUDE OF AN UNKNOWN RESISTANCE ELEMENT

FIELD OF THE INVENTION

My present invention relates to a method of and a circuit arrangement for performing analog/digital conversions, more particularly for ascertaining in digital terms the magnitude of an unknown resistance element to be used in turn for measuring electrical signals.

BACKGROUND OF THE INVENTION

A convenient procedure for digitally determining the magnitude of an unknown resistance resides in connecting same in circuit with a fixed capacitance to form an RC network whose time constant is a function of that resistance. A network of this type may be used in a one-shot pulse generator, such as a monostable multivibrator (monoflop) or univibrator, to establish a gating period whose duration T, depending on that time constant, is measured by counting the number of pulses emitted with a recurrence period t in the course of this period by a free-running oscillator, such as an astable multivibrator or flip-flop. When the unknown resistance element is replaced by a known calibrating resistance, the ratio T/t changes in accordance with the relative magnitudes of the two resistances. The same result can be had by using a gating-pulse generator of fixed duration T and varying the recurrence period t by alternately inserting the known calibrating resistance and the unknown resistance in an RC network forming part of the counting-pulse generator.

In the first instance, the duration T′ of a gating period is given by $$T' = R' \cdot C \cdot Q' \tag{1}$$

where R′ represents either the known calibrating resistance or the unknown resistance to be measured, C is the fixed capacitance and Q′ is the natural logarithm of a constant taking into account the switching thresholds of the pulse generator. Thus the number N′ of counting pulses generated during period T′ is given by the relationship $$N' = (T'/t') = f' \cdot R' \cdot C \cdot Q' \tag{2}$$

where f′ = 1/t′ is the repetition frequency or cadence of the counting pulses.

In the second instance, with the gating period having a fixed duration T″ and with the cadence of the counting pulses determined by the magnitude of the resistive branch of the RC network in the free-running pulse generator, that cadence is given by the relationship $$f = (1/t'') = (1/R'' \cdot C \cdot Q'') \tag{3}$$

where t″ is the variable counting-pulse cadence, R″ again represents either the unknown resistance or the calibrating resistance, and Q″ is the natural logarithm of a constant based on the switching thresholds of the astable circuit. The pulse count N″ during each gating period T″ is then given by the relationship $$N'' = (T''/t'') = (T''/R'' \cdot C \cdot Q'') \tag{4}$$

Theoretically, therefore, the network resistance R′ is directly proportional to the pulse count N′ in the first instance, represented by equation (2), whereas the network resistance R″ is inversely proportional to the pulse count N″ in the second instance, represented by equation (4).

As a practical matter, however, this proportionality does not strictly hold true. Parasitic line impedances, in particular, influence the time constant of the switchable RC network and thus tend to falsify the results of comparison of the pulse counts obtained with the calibrating and the unknown resistance. The effects of this measuring error are, of course, more aggravated as the ratio T/t is increased in order to provide a higher degree of resolution.

OBJECTS OF THE INVENTION

An important object of my present invention, therefore, is to provide an improved method of measuring unknown resistances by the aforedescribed technique of comparison with a known calibrating resistance which takes into account any parasitic circuit parameters and allows an accurate resistance determination with a digital resolution of 12 bits or better.

A related object is to provide a circuit arrangement for carrying out this method, preferably automatically with the aid of a microprocessor.

SUMMARY OF THE INVENTION

I have found, in accordance with my present invention, that parasitic errors inherent in a measuring system of the character set forth can be largely eliminated by the use of not one but two calibrating resistances of known magnitudes $R_1$ and $R_2 = mR_1$, with $m > 1$; the factor m is advantageously but not necessarily an integer. By respectively inserting the two calibrating resistances $R_1$, $R_2$ and the unknown resistance $R_i$ during different gating periods in the switchable RC network of either the one-shot gating-pulse generator or the free-running counting-pulse generator, as discussed above, I may calculate the ratio $R_i/R_1$ from the respective pulse counts $N_1$, $N_2$ and $N_i$, obtained in these three gating periods, with the aid of a formula which includes a corrective term E of the form $$E = \frac{N_x - mN_y}{N_x - N_y}$$

where $N_x$ is the larger and $N_y$ is the smaller of the two calibration counts $N_1$ and $N_2$. With $mN_y = N_x$, i.e. when there is no error affecting the result within the degree of resolution established by the ratio T/t, this corrective term vanishes.

In the case of direct proportionality, as discussed with reference to equation (2), the complete formula will have the form $$\frac{R_i}{R_1} = \frac{(m-1)N_i + N_2 - mN_1}{N_2 - N_1} \tag{5}$$

in accordance with a more particular feature of my invention. If the aforementioned parasitic line impedances are designated $R_p$, the foregoing equation (5) can be derived from the following expressions:

$$N_i = (R_i + R_p)Z = R_iZ + R_pZ = R_iZ + P \tag{6}$$

$$N_1 = R_1Z + P \tag{7}$$

$$N_2 = R_2 Z + P = m R_1 Z + P \quad (8)$$

where Z is a multiplier including the factors f', C and Q' of equation (2). Subtraction of equation (7) from equation (8) yields $$N_2 - N_1 = (m-1) R_1 Z \quad (9)$$

whence $$R_1 = \frac{N_2 - N_1}{(m-1)Z} \quad (10)$$

$$Z = \frac{N_2 - N_1}{(m-1)R_1}. \quad (11)$$

Multiplication of equation (7) by the factor m and subtraction therefrom of equation (8) yields $$m N_1 - N_2 = (m-1) P \quad (12)$$

whence $$P = \frac{m N_1 - N_2}{m - 1} \quad (13)$$

When the expressions for Z and P from equations (11) and (13) are substituted in equation (6), the result is $$R_i = \frac{N_i - P}{Z} = \frac{(m-1)N_i + N_2 - m N_1}{N_2 - N_1} R_1 \quad (14)$$

which of course corresponds to formula (5) and can also be rewritten as $$\frac{R_i}{R_1} = \frac{(m-1)N_i}{N_2 - N_1} + E \quad (15)$$

With inverse proportionality, as discussed with reference to equation (4), the formula becomes $$\frac{R_i}{R_1} = \frac{m-1}{m(N_1 - N_2)} \left( \frac{m N_1 N_2}{N_i} + N_1 - m N_2 \right) \quad (16)$$

pursuant to this more particular feature. It will be seen that equations (5) and (6) include respective additive terms $$\frac{N_2 - m N_1}{N_2 - N_1} \text{ and } \frac{N_1 - m N_2}{N_1 - N_2}$$

which correspond to the foregoing corrective term since $N_2 > N_1$ in the first case and $N_2 < N_1$ in the second case. If there is no measurable error, i.e. if $N_2$ equals $N_1$ multiplied or divided by m, these equations reduce to $(N_i/N_1)$ or $(N_1/N_i)$, respectively.

BRIEF DESCRIPTION OF THE DRAWING

The above and other features of my invention will now be described in detail with reference to the accompanying drawing in which.

SPECIFIC DESCRIPTION

Figure 1:
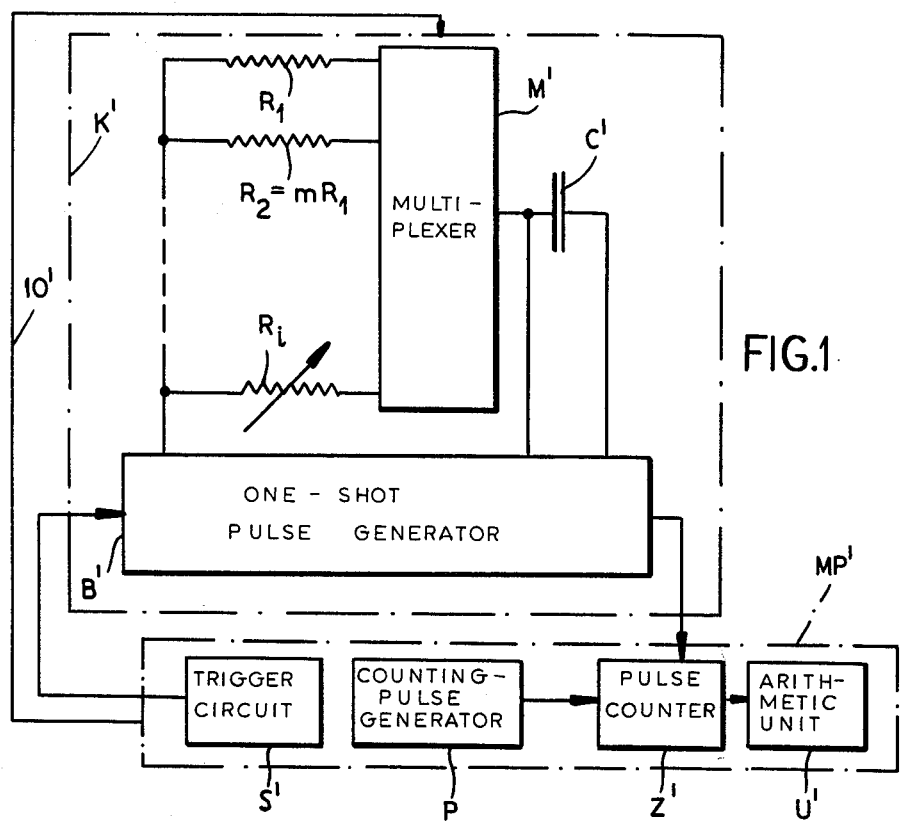
FIG. 1 is a block diagram of an analog/digital converter for measuring unknown resistances in accordance with a first embodiment of my present invention.

In FIG. 1 I have shown an analog/digital converter according to my invention which comprises a switchable oscillator K' including a one-shot pulse generator B' as an active component. This oscillator is provided with a resistive/capacitive timing network including a fixed capacitor C' and, as its resistive branch, two calibrating resistors $R_1$ and $R_2$ along with one or more resistance elements $R_i$ of unknown magnitude (only one shown) that can be alternately connected in circuit with capacitor C' by means of a multiplexer M'. Pulse generator B' works into a pulse counter Z' which is stepped by a counting-pulse generator P in the form of a free-running oscillator preferably designed as an astable binary circuit. Pulse counter Z' feeds an arithmetic unit U' operating in accordance with foregoing equation (5), on the basis of factor $m = R_2/R_1$, upon receiving respective pulse counts $N_1$, $N_2$ and $N_i$ obtained (not necessarily in that order) in different working positions of multiplexer M', i.e. with the corresponding resistance $R_1$, $R_2$ or $R_i$ in circuit. Pulse generator P, pulse counter Z' and arithmetic unit U' form part of a microprocessor MP' which also includes a trigger circuit S' for starting the one-shot pulse generator B' after each repositioning of multiplexer M'. The switching of the multiplexer may be carried out by signals sent over a connection 10' from a nonillustrated timer in microprocessor MP' coacting with trigger circuit S'.

Figure 3:
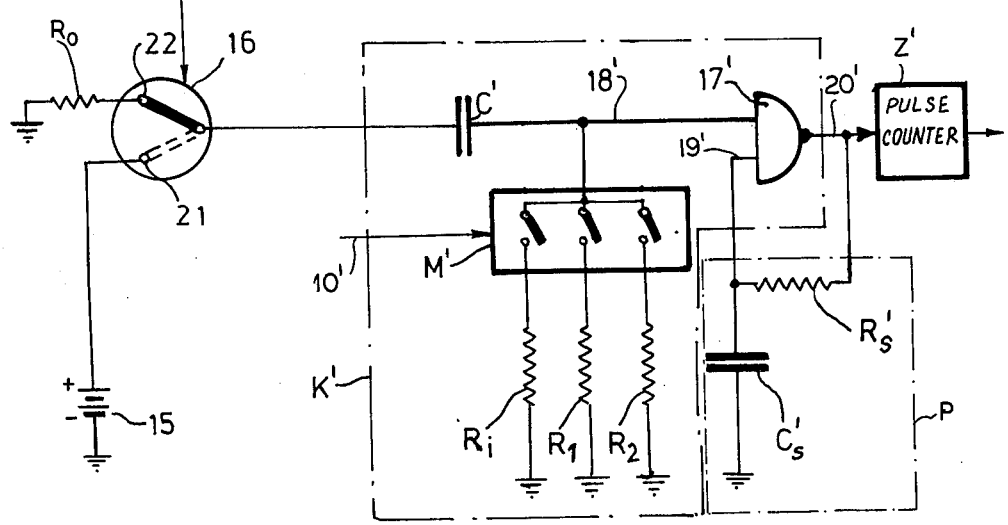
FIG. 3 shows details of some of the circuitry included in the embodiment of FIG. 1.

Details of the converter of FIG. 1 are shown in FIG. 3 where the oscillator K' is seen to include, besides capacitor C', multiplexer M' and resistors $R_1$, $R_2$ and $R_i$, a NAND gate 17' with one input 18' connected to capacitor C' and with another input 19' connected to a junction of a fixed capacitor $C_s'$ with a fixed resistor $R_s'$ which together constitute a timing network for counting-pulse generator P. One plate of capacitor $C_s'$ and one end of each resistor of circuit K' is grounded. NAND gate 17' has an output 20' connected on the one hand to pulse counter Z' and on the other hand to the opposite end of resistor $R_s'$, the latter forming a feedback path for the active element of this gate.

A preferably electronic switch 16, controlled by the trigger circuit S' of FIG. 1, has an input 21 connected to the positive terminal of a d-c source shown as a battery 15 with grounded negative terminal; another input 22 is grounded via a resistor $R_o$ through which capacitor C' is discharged in the full-line position of switch 16. In that inactive switch position, NAND gate 17' common to both pulse generators K' and P conducts so that capacitor $C_s'$ is charged; this maintains the pulse generator P in a stable state without any advance of the previously reset counter Z'.

With multiplexer M' connecting, say, resistor $R_1$ to the gate input 18', a reversal of switch 16 into its dotted-line position generates a positive pulse which is in the charged state of capacitor $C_s'$ cuts off the NAND gate 17' for a period of duration T' determined by the magnitude of the inserted resistor. Capacitor $C_s'$ immeatiately begins to discharge through an internal output resistance of gate 17' until that gate, operating in the manner of a Schmitt trigger with two well-defined thresholds, conducts again to recharge the capacitor $C_s'$. Thus, generator P produces a rapid succession of counting pulses whose cadence $f' = 1/t'$ is determined by the time constant of network $C_s'$, $R_s'$; the calibrated time constant of the monostable or one-shot pulse generator $K'$ as determined by resistor $R_1$ is preferably several thousand times that of the astable pulse generator P. At the end of period T', when the charging current flowing through multiplexer M' and the inserted resistor (e.g. $R_1$) has lowered the potential of input 18' to near-zero, NAND gate 17' remains conductive whereby pulse generator P is cut off with capacitor $C_s'$ charged as described above. The reading of pulse counter Z' is then transferred, under the control of the timing circuit of microprocessor MP', to the arithmetic unit U' thereof whereupon multiplexer M' is repositioned and the same procedure is repeated with, say, calibrating resistor $R_2$ inserted in the timing network of oscillator K'. Once the two counts $N_1$ and $N_2$ are registered, the magnitude of resistor $R_i$ and, possibly, of other unknown resistance elements in parallel therewith can be determined from their respective pulse counts $N_i$ by the arithmetic unit on the basis of equation (5).

Figure 2:
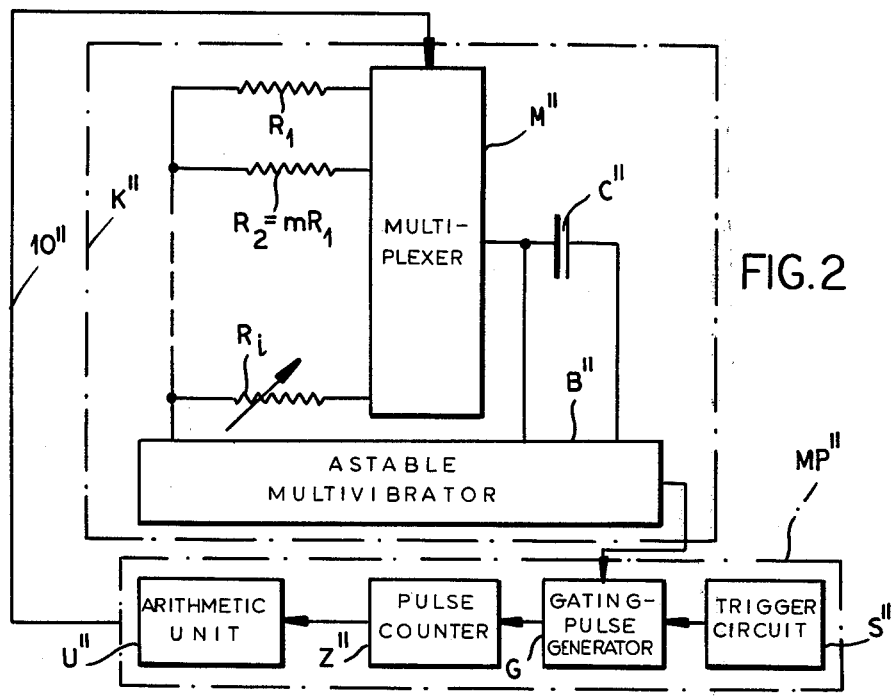
FIG. 2 is a block diagram of an analog/digital converter similar to that of FIG. 1 but relating to a second embodiment.

In FIG. 2 I have shown an analog/digital converter with a free-running oscillator K'' including an astable binary circuit B'' as its active element. Calibrating resistors $R_1$, $R_2$ as well as one or more unknown resistors $R_i$ are again alternately insertable, with the aid of a multiplexer M'', in circuit with a fixed capacitor C'' to form part of a timing network determining in this instance the pulse period of the high-frequency generator B''. The latter works into a gating-pulse generator G which, when turned on by a trigger circuit S'', passes to a pulse counter Z'' the pulses emitted by generator B'' during a fixed gating period T''. Trigger circuit S'', gating-pulse generator G, pulse counter Z'' and an associated arithmetic unit U'' form part of a microprocessor MP'' controlling the switchover of multiplexer M'' via connection 10''. The operation of the converter of FIG. 2 is generally similar to that of the converter shown in FIG. 1, except that its arithmetic unit U'' operates in accordance with equation (16).

Figure 4:
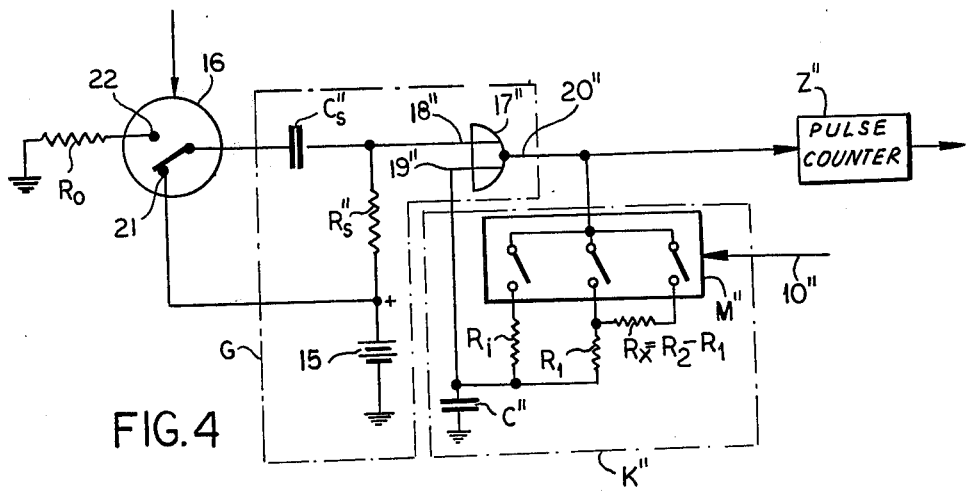
FIG. 4 shows details of some of the circuitry included in the embodiment of FIG. 2.

As shown in FIG. 4, gating-pulse generator G comprises a fixed capacitor $C_s''$ and a fixed resistor $R_s''$ whose junction is connected to one input 18'' of a NOR gate 17'' having its other input 19'' tied to the junction of capacitor C'' with a common terminal of the several resistors to be alternately inserted in the timing network of oscillator K'' by multiplexer M'' connected to the output 20'' of gate 17''. As here illustrated by way of example, the second calibrating resistance is constituted by resistor $R_1$ and a supplemental resistor of magnitude $R_x = R_2 - R_1$ which in the corresponding multiplexer position is inserted, in series with resistor $R_1$, between capacitor C'' and gate output 20''. The positive terminal of battery 15 is here tied on the one hand to resistor $R_s''$ and on the other hand to input 21 of electronic switch 16 whose other input 22 is again grounded, as in FIG. 3, by way of a resistor $R_o$.

The time constant of network $R_s''$, $C_s''$ in FIG. 4 exceeds, preferably by several thousand times, the time constant established in oscillator K'' by capacitor C'' and calibrating resistor $R_1$.

With switch 16 in its illustrated position on input 21, capacitor $C_s''$ is discharged as both plates thereof are at positive battery potential. When multiplexer M'' is switched into one of its working positions, e.g. the one which inserts calibrating resistor $R_1$, capacitor C'' is discharged through the inserted network resistor and an internal output resistance of gate 17''. A reversal of switch 16 then applies a negative-going pulse to the input 18'' of gate 17'' which, again operating with two well-defined thresholds in the manner of a Schmitt trigger, conducts until its output current has charged capacitor C'' through the inserted resistor to a cut-off level. The resulting advance of pulse counter Z'' is followed by another discharge of capacitor C'' and the emission of a further counting pulse from generator K''; the number of such pulses emitted within the gating period T'' established by network $R_s''$, $C_s''$ is registered in counter Z'' and then transferred to arithmetic unit U'' for further processing in conformity with equation (6). These proceedings are, of course, repeated in different working positions of multiplexer M''.

Elements 17' and 17'' are representative of a variety of coincidence gates that could be used as a common component of the monostable and astable pulse generators of my improved analog/digital converter. Thus, for example, NAND gate 17' could be replaced by an AND gate with an inverting input 19' driven by pulse generator P, the operation of this pulse generator differing from that described with reference to FIG. 3 in that its capacitor $C_s'$ is discharged in the inactive state.

The use of a supplemental resistor $R_x$ in FIG. 4 is representative of various ways in which two calibrating resistances $R_1$ and $mR_1$ can be made alternately available. Thus, the multiplexer may short-circuit in one of its working positions a portion of a calibrating resistor of magnitude $R_2$ to obtain the other calibrating resistance $R_1$.

I claim:

1. A method of digitally determining the magnitude of $R_i$ of an unknown resistance element, comprising the steps of:

establishing a recurrent gating period T with the aid of a first timing network;

establishing, with the aid of a second timing network, a train of counting pulses with a recurrence period t substantially shorter than said gating period T;

providing different ratios T/t in three different gating periods by respectively inserting a first known calibrating resistance of magnitude $R_1$, a second known calibrating resistance of magnitude $R_2 = mR_1$ with $m > 1$, and the unknown resistance element in circuit with an unvarying capacitance in said first timing network;

registering the number of counting pulses $N_1$, $N_2$ and $N_i$ respectively occurring in said three gating periods; and calculating the ratio $R_i/R_1$ from the counts $N_1$, $N_2$, $N_i$, said counts $N_1$, $N_2$, $N_i$ varying substantially in direct proportion to the magnitudes $R_1$, $R_2$, $R_i$, and from the factor m according to a formula given by $$\frac{R_i}{R_1} = \frac{(m-1)N_i + N_2 - mN_1}{N_2 - N_1}.$$

2. An analog/digital converter for digitally determining the magnitude $R_i$ of an unknown resistance element, comprising:

a one-shot pulse generator, provided with a first timing network, iteratively triggerable to establish a recurrent gating period T;

a free-running pulse generator, provided with a second timing network, for emitting a train of counting pulses with a recurrence period $t \ll T$;

switchover means in said first timing network having a first, a second and a third position for respectively connecting a first known calibrating resistance of magnitude $R_1$, a second known calibrating resistance of magnitude $R_2 = mR_1$ with $m > 1$, and said unknown resistance element in circuit with a fixed capacitor;

counting means connected to be stepped by said free-running pulse generator in an active state of said one-shot pulse generator for registering a pulse count $N_1$ during one gating period with said switchover means in said first position, a pulse count $N_2$ during another gating period with said switchover means in said second position, and a pulse count $N_i$ during a further gating period with said switchover means in said third position; and arithmetic means connected to said counting means for calculating the ratio $R_i/R_1$ from the counts $N_1$, $N_2$, $N_i$, said counts $N_1$, $N_2$, $N_i$ varying substantially in direct proportion to the magnitudes $R_1$, $R_2$, $R_i$, and from the factor m, said arithmetic means being adapted to calculate said ratio according to the formula $$\frac{R_i}{R_1} = \frac{(m-1)N_i + N_2 - mN_1}{N_2 - N_1}.$$

3. A converter as defined in claim 2 wherein said second timing network comprises a fixed resistor in circuit with another fixed capacitor, said one-shot pulse generator further including a coincidence gate with inputs connected to the capacitors of both timing networks and with an output connected to said counting means, said second timing network forming a resistive feedback path between the output and one of the inputs of said coincidence gate for temporarily blocking same upon a charging of the capacitor of said second timing network.

4. A converter as defined in claim 3 wherein said second timing network, said coincidence gate, said counting means and said arithmetic means are part of a microprocessor also including signaling means for triggering said one-shot pulse generator and operating said switchover means in a predetermined sequence.

* * * * *